United States Patent
Phan et al.

(10) Patent No.: US 6,808,591 B1
(45) Date of Patent: Oct. 26, 2004

(54) MODEL BASED METAL OVERETCH CONTROL

(75) Inventors: Khoi A. Phan, San Jose, CA (US); Bharath Rangarajan, Santa Clara, CA (US); Christopher F. Lyons, Fremont, CA (US); Steven C. Avanzino, Cupertino, CA (US); Ramkumar Subramanian, San Jose, CA (US); Bhanwar Singh, Morgan Hill, CA (US); Cyrus E. Tabery, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 92 days.

(21) Appl. No.: 10/021,531

(22) Filed: Dec. 12, 2001

(51) Int. Cl.[7] .......................................... H01L 21/302
(52) U.S. Cl. ..................... 156/345.24; 156/345.25; 156/345.26; 156/345.33; 156/345.51
(58) Field of Search ................. 156/345.24, 345.25, 156/345.26, 345.33, 345.51; 438/720, 723

(56) References Cited

U.S. PATENT DOCUMENTS

| | | | |
|---|---|---|---|
| 5,780,315 A | * 7/1998 | Chao et al. | ..................... 438/8 |
| 5,977,542 A | 11/1999 | Singh et al. | ................. 250/307 |
| 6,136,721 A | * 10/2000 | Kumihashi et al. | ......... 438/714 |
| 6,322,935 B1 | * 11/2001 | Smith | ............................ 430/5 |

* cited by examiner

Primary Examiner—Nadine G. Norton
Assistant Examiner—Binh X. Tran
(74) Attorney, Agent, or Firm—Amin Turocy, LLP

(57) ABSTRACT

A systems and methodologies are provided for metal overetch control. Metal overetch processes are controlled by utilizing overetch device models to determine overetch times or overetch endpoints. The systems and methodologies reduce the need for manual testing and manual overetch characterization. An overetch system includes a metal etcher, a target device and an overetch controller. The target device is located in or on the metal etcher. The overetch controller is coupled to the metal etcher. The overetch controller controls overetching of the target device by the metal etcher. The overetch controller includes an overetch time controller, a set of etch control models and a control system.

24 Claims, 12 Drawing Sheets

MODEL BASED METAL OVERETCH CONTROL

FIELD OF INVENTION

The present invention relates generally to etching semiconductor devices and in particular to systems and methods utilizing layout data and models for metal overetch control.

BACKGROUND OF THE INVENTION

The use of and demand for semiconductor devices are increasing. Constant development of these devices requires constant improvements in size, performance and yield. These improvements are accomplished by improving the various processes used in semiconductor fabrication. Metal etch processes are often a challenge for sort yield and process control.

One process used in semiconductor fabrication is metalization. Metalization generally involves forming metal layers, interconnects, contacts and plugs. Some metallization processes involve depositing a metal material and performing a chemical mechanical planarization (CMP) process to remove selected portions of the metal material. The CMP process may use CMP endpointing techniques to remove metal material from oxide surfaces without removing too much of the oxide surface.

Other metallization processes involve forming an oxide layer, depositing metal material and removing selected portions of the metal material by etching. An overetch or secondary etch step is then performed to remove remaining metal material and films from oxide surfaces while removing a small amount of the oxide layer. The overetch step avoids a number of problems, such as shorting or bridging, that occur when metal materials are not completely removed from the selected areas. The overetch step intentionally removes a small amount of the oxide layer to ensure that metal is removed from the oxide surface. The etch step is controlled by using an end point detector. However, the overetch step typically can not use an end point detector. Typically, several test wafers are used to characterize oxide loss, wafer profile and overetch process time. For example, several splits of wafers can be used at various percentages of an overetch estimate, such as 10%, 20%, 30% and the like. After the overetch step has been performed, the splits are analyzed to measure oxide loss, profile and the like. This use of test wafers is a time consuming and expensive process.

FIGS. 1A, 1B and 1C illustrate under etch and overetch problems encountered with conventional metal etch processes. FIG. 1A illustrates a semiconductor device prior to a conventional metal etch. The semiconductor device comprises a substrate having at least one semiconductor layer 101, an oxide layer 102 formed on the substrate 101, a plurality of trenches 105 formed in the oxide layer 102 and a metal layer 104 formed over the oxide layer 102. The metal layer 104 is comprised of aluminum or an aluminum alloy.

FIG. 1B illustrates the semiconductor device after a conventional metal etch. FIG. 1B illustrates a typical under etch condition. Most of the metal layer 104 has been removed, but a film 106 or small portion of the metal layer 104 remains. The film 106 may cause a multitude of problems, such as bridging.

FIG. 1C illustrates the semiconductor device after a conventional metal etch. FIG. 1C illustrates a typical, undesireable overetch condition. The metal layer 104 has been removed. However, a large amount of the oxide layer 102 has been removed as indicated by the dotted lines 107. The removed oxide is beyond a tolerable or permissable amount and may render the semiconductor device inoperable.

Therefore, there is an unmet need in the art for new and improved metal overetch control, which reduces costs and more accurately performs overetch processes.

SUMMARY OF THE INVENTION

A system and methodology is provided for facilitating metal overetch control. Metal overetch processes are controlled by utilizing overetch device models.

An overetch system according to one aspect of the invention is disclosed. The overetch system includes a metal etcher, a target device and an overetch controller. The target device is located in or on the metal etcher. The overetch controller is coupled to the metal etcher. The overetch controller controls overetching of the target device by the metal etcher.

An overetch system according to one aspect of the invention is disclosed. The overetch system includes a metal etcher, a target device and an overetch controller. The target device is located in or on the metal etcher. The overetch controller is coupled to the metal etcher. The overetch controller controls overetching of the target device by the metal etcher. The overetch controller includes an overetch time controller, a set of etch control models and a control system. The overetch time controller initiates and halts the metal etcher during overetch processes.

A method of fabricating a semiconductor device according to one aspect of the invention is disclosed. A wafer having at least one semiconductor layer is provided. An oxide layer is formed over the at least one semiconductor layer. A plurality of trenches are formed in the oxide layer. A metal layer is formed over the oxide layer and in the plurality of trenches. A resist layer is deposited over the metal layer. A metal etch is performed to substantially remove the metal layer leaving remaining residue and metal lines in the plurality of trenches. An effective overetch rate is determined for the semiconductor device by utilizing an etch rate model. An overetch endpoint is determined. An overetch is performed according to the overetch endpoint to remove a tolerable amount of the oxide layer and the remaining residue.

A method of fabricating a semiconductor device according to one aspect of the invention is disclosed. A semiconductor device having remaining residue on a first layer is provided. A three dimensional overetch model is used to determine an overetch endpoint. An overetch process is performed according to the overetch endpoint to remove a tolerable amount of the first layer and the remaining residue.

A method of fabricating an overetch control model for a semiconductor device according to one aspect of the invention. A two dimensional layout of the semiconductor device is provided. Information for a third dimension is added. An etchable area is determined. At least one etch rate region is determined. An etch rate is assigned to the at least one etch rate region. The at least one etch rate region and the etchable area are compared to existing overetch models. An acceptable etch rate is calculated.

However, it will be recognized that the invention finds utility in association with semiconductor fabrication generally, and that the invention is thus not limited to any particular embodiment or implementation disclosed and described herein.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
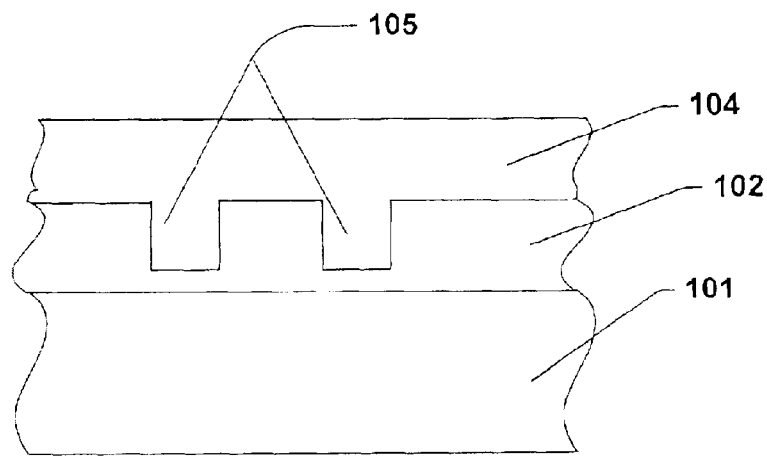
FIG. 1A is a semiconductor device prior to a conventional metal etch.
Figure 1B:
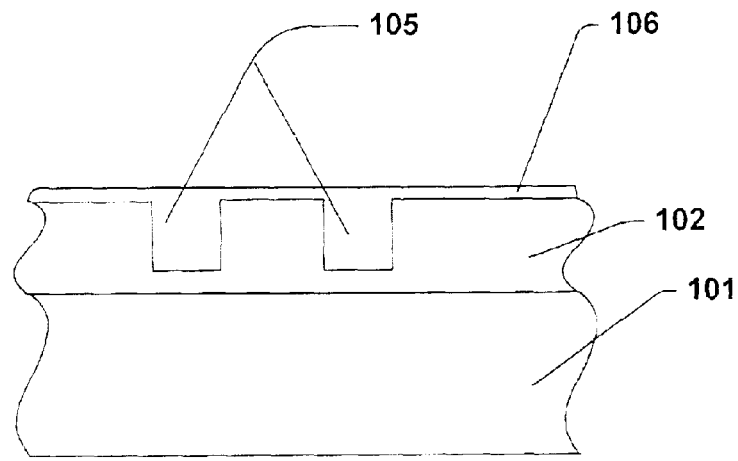
FIG. 1B illustrates a typical under etch condition after a conventional metal etch.
Figure 1C:
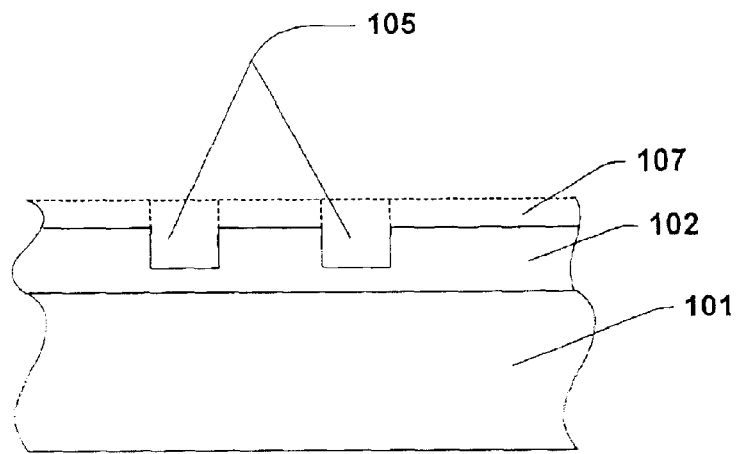
FIG. 1C illustrates a typical undesireable overetch condition after a conventional metal etch.

The following is a detailed description of the present invention made in conjunction with the attached figures, wherein like reference numerals will refer to like elements throughout.

Figure 2:
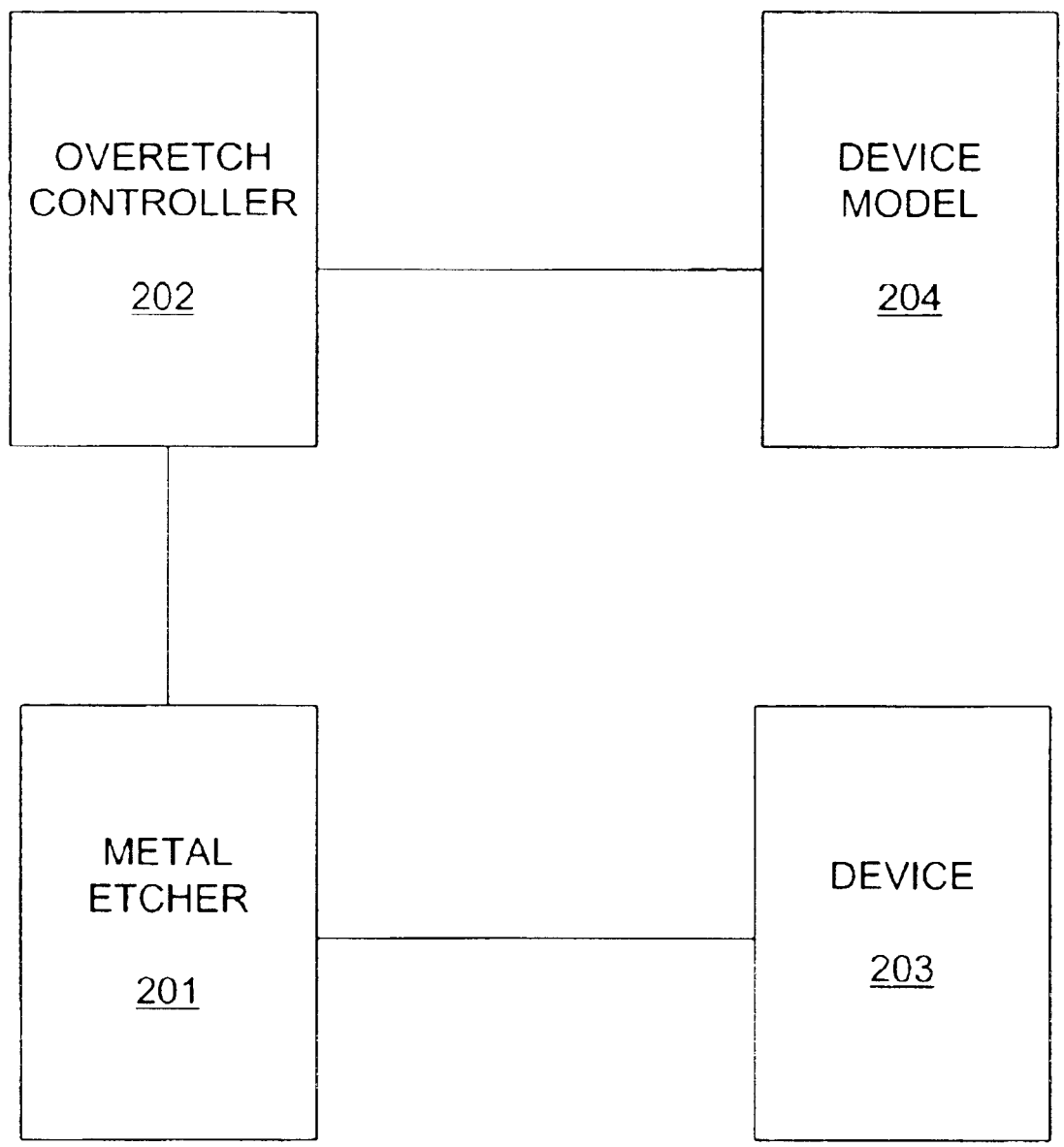
FIG. 2 is a block diagram of an overetch system.

Referring now to the figures, FIG. 2 is a block diagram of an overetch system according to one aspect of the invention. The system includes an overetch controller 202, a metal etcher 201, a target device 203 and a device model 204. The target device 203 is a semiconductor device having an aluminum or aluminum alloy metal layer. The metal etcher 201 is a typical metal etcher. The metal etcher 201 performs conventional metal etch processes. The metal etcher also performs overetch processes and is controlled by the overetch controller 202 for the overetch processes. The overetch processes may also be referred to as secondary etch processes. It is appreciated that the overetch processes and the metal etch processes may utilize different chemistries.

The device model 204 is connected to the overetch system controller 202. The device model 204 is a software based model of the target device 203 and can include all of the information included in optical process correction (OPC) library cells or models. The device model 204 is based on the chip design and layout of the target device 203. It is appreciated that a single chip design can have a number of different layouts. Thus, the device model 204 can have information based on a variety of layouts for a single chip design. However, layouts are constrained by design rules such as, but not limited to, minimum pitch, line width, spacing and the like. These rules are included in the device model 204 in order to ensure that they are not broken by an overetch process. A number of adjustable parameters, such as, percent etchable area and pattern density are also included in the device model 204. The device model 204 is able to characterize, provide or set parameters such as overetch etch rate, critical dimensions (CD), maximum acceptable oxide loss, minimum uniformity and the like. It is appreciated that the information contained in the device model 204 can be modified by the controller 202.

The overetch controller 202 controls the overetch process performed by the metal etcher 201 so that an overetch amount of material, typically an oxide layer, is removed from the target device 203. The overetch amount is an amount of material etched to ensure that all of the metal is removed from designated areas and that no metal or metal residue remains. The overetch amount depends on the implementation. The overetch controller 202 identifies the target device and determines the time required for performing the overetch process. The overetch controller 202 monitors several parameters of the target device 203 during the overetch process. The monitored parameters can include a variety of parameters such as, but not limited to, etch rate, CD, oxide loss and uniformity. By controlling the metal etcher 201, the overetch controller 202 can modify and adjust the overetch process according to the design rules and parameters contained in the device model 204, based on the monitored parameters. It is appreciated that the overetch controller 202 can update and modify the device model 204 as necessary. It is also appreciated that the time of the overetch process can be adjusted.

Figure 3A:
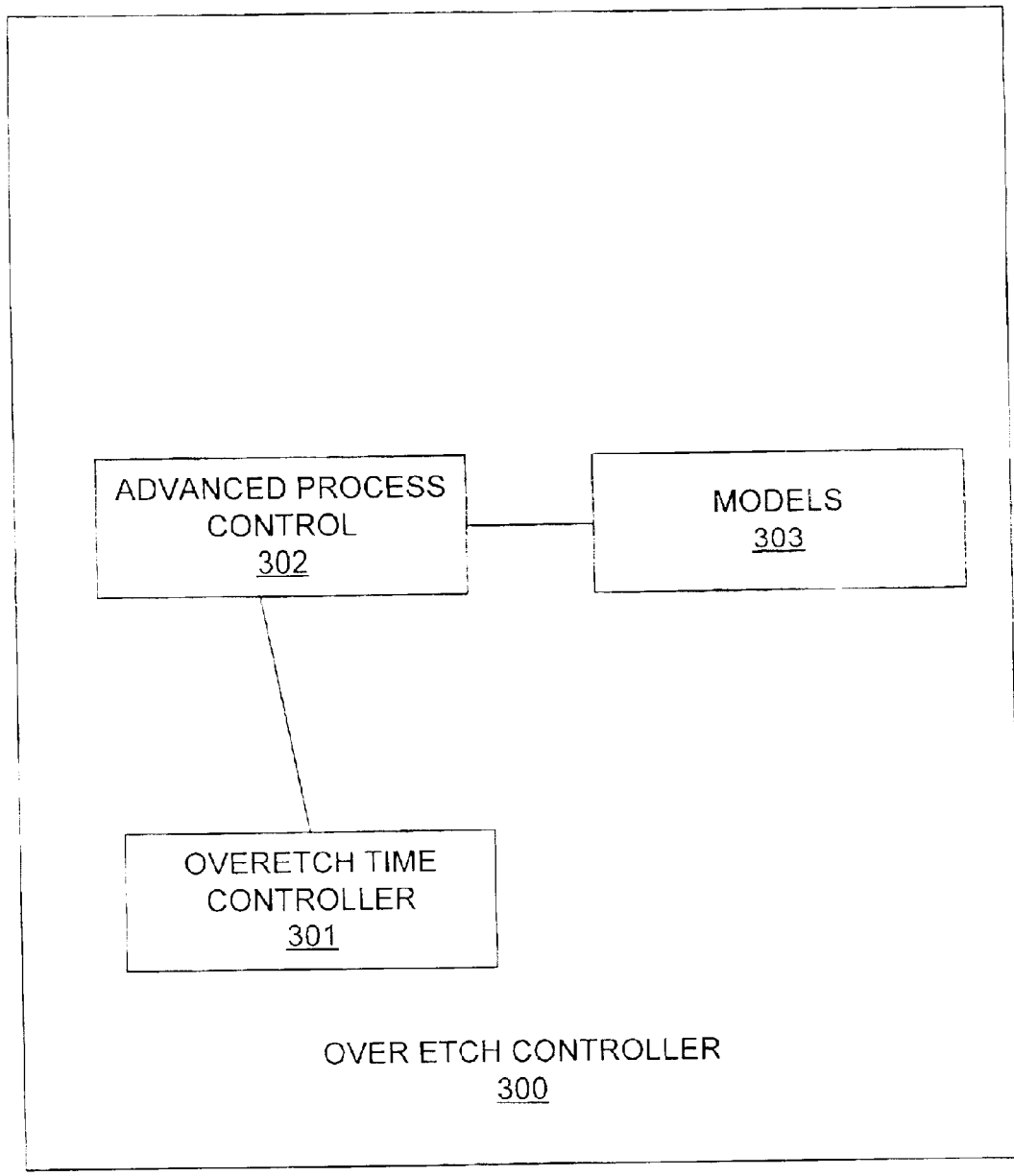
FIG. 3A is a block diagram of an overetch controller.

FIG. 3A is a block diagram of an overetch controller 300 according to one aspect of the invention. The controller 300 may be used in an etch system, such as is described in FIG. 2. It is appreciated that other implementations of an overetch controller may be used in an etch or overetch system and be in accordance with the present invention. The overetch controller 300 includes an overetch time controller 301, an advanced process control (APC) 302 and a set of etch control models 303.

The overetch time controller 301 initiates and halts an overetch process. The overetch time controller 301 ensures that the overetch process lasts as required for a target device. It is appreciated that the overetch time controller 301 can include a metal etcher.

The etch control models 303 contain a variety of information useful in controlling overetch processes. For example, the etch control models 303 can contain information such as layout data, etchable area, pattern density, percentage of etchable area, open area, percentage of open area, expected etch rates and actual etch rates for a variety of semiconductor devices and/or chip design. In addition to the information above, each model can include design rules, constraints or boundary conditions such as minimum pitch, line size, spacing and other minimum geographies. Generally, design rules are determined by the type of device and/or size. For example, design rules vary for 0.25 micron, 0.18 micron and 0.13 micron feature size devices. The design rules reduce effects such as proximate effects and phase shifting effects. It is appreciated that a single chip design can have a number of layouts to provide different functionality. For example, a flash memory device can have one layout for use in a server and another layout for use in a wireless phone. It is also appreciated that each model includes constraint parameters, such as, etch rate, CD, allowable oxide loss and uniformity.

The etch control models 303 are able to compute and provide output parameters for the overetch process. The output parameters are computed as a function of the layout, design rules, boundary conditions, constraints and desired etch parameters. The output parameters can include, but are not limited to, overetch rate and ideal overetch time.

The APC 302 is generally responsible for controlling the overetch process. The APC 302 identifies a target device. A user or operator may enter identification information for the target device. The APC 302 finds one or more relevant models from the set of etch control models 303. Additionally, a user or operator may identify one or more relevant models from the set of etch control models 303. The APC 302 calculates an overetch time from the one or more relevant models. The APC 302 may simply use the output parameters from the etch control models 303. The APC 302 sends the overetch time to the overetch time controller 301. The APC 302 also receives and analyzes feedback data for the target device during an overetch process. The feedback data includes monitoring data such as etch rate, oxide loss, CD, profile and uniformity. The APC 302 compares this feedback data with identified models to determine if corrections or adjustments to the overetch process need to be made. If needed, the APC 302 makes those adjustments. For example, the APC 302 can adjust the etch rate on feedback data indicating uniformity above the parameter allowed from the identified models. For another example, the APC 302 can determine that one or more parameters are changing too fast and adjust the process accordingly. It is noted that the various components or parameters of the feedback data are interrelated. However, adjustments in the chemistry and operation of the overetch process can influence one parameter more than another. Thus, the APC 302 can control the parameters, at least somewhat, individually.

In addition to controlling the overetch process, the APC 302 also generates and modifies the etch control models 303. The APC 302 may modify a model because actual etch rates were different than those previously in the model. The APC 302 may generate new models based on existing models and/or update existing models. Additionally, a user or operator may input new models for the set of etch control models 303.

It is also appreciated that yield is somewhat dependent on the overetch process. Thus, the etch control models 303 can include yield information or yield estimates. The APC 302 can provide a yield estimate based on overetch process parameters and can modify the process to increase the yield.

Figure 3B:
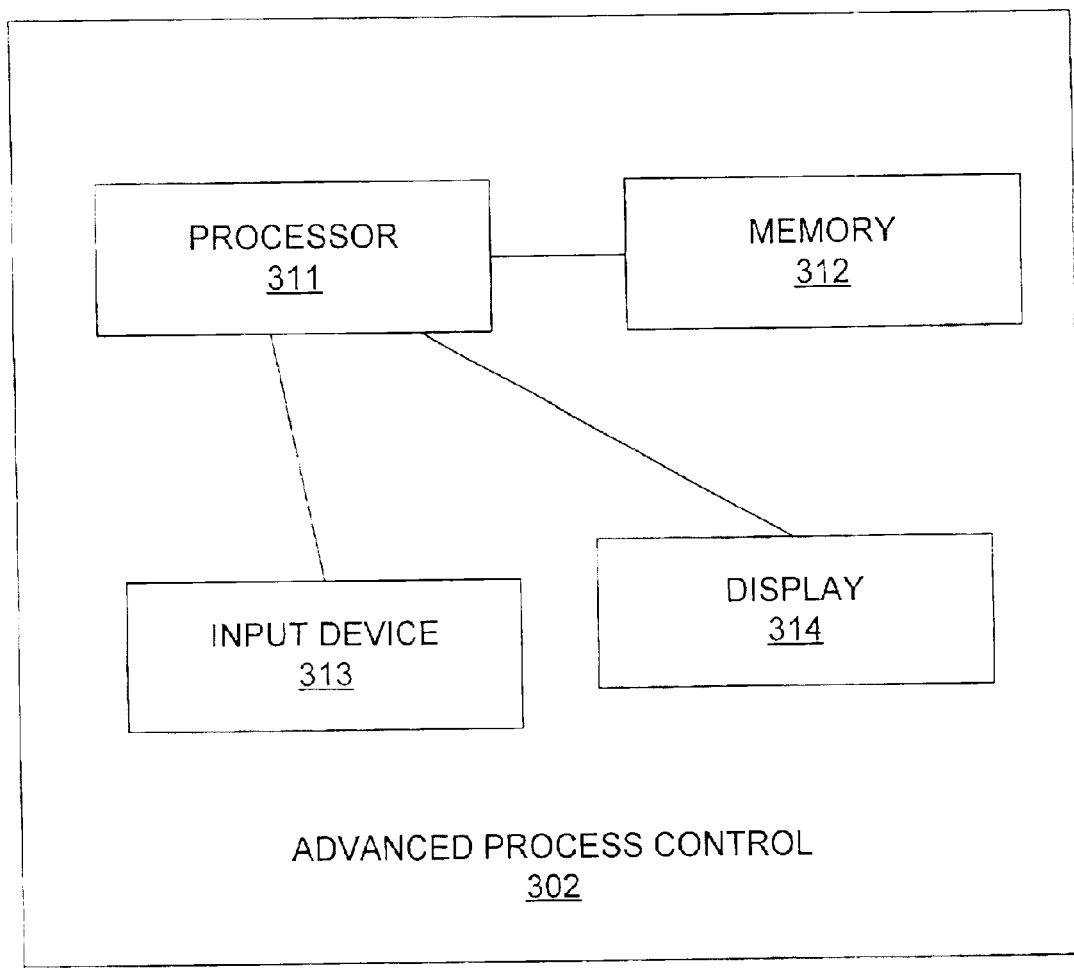
FIG. 3B is a block diagram of an overetch controller.

FIG. 3B is a block diagram illustrating an advanced process control (APC) 302 according to one aspect of the invention. The APC 302 includes at least one processor 311 and a memory 312. The APC 302 may additionally include an input device 313 and a display 314. The at least one processor 311 may be any of a plurality of processors, such as the AMD K6, ATHLON or other similar processors. The manner in which the at least one processor 311 can be programmed to carry out the functions relating to the present invention will be readily apparent to those having ordinary skill in the art based on the description herein.

The memory 312 serves to store program code executed by the at least one processor 311 for carrying out operating functions of the system as described herein. The memory 312 may include read only memory (ROM) and random access memory (RAM). The ROM contains, among other code, the Basic Input-Output System (BIOS) which controls the basic hardware operations of the APC 302. The RAM is the main memory into which the operating system and application programs are loaded. The memory 312 also serves as a storage medium for temporarily storing information such as etch rates, time values, layout data, other data and algorithms that may be employed in carrying out the present invention. The memory 312 may additionally include a hard disk drive or other mass storage device. The hard disk may be used to store the library or set of models 303.

The input device 313 comprises one or more input devices such as a keyboard and mouse. The input device 313 is used for modifying or adding models to the set of models 303. The display device 314 is used for displaying textual and graphical information for a user or operator to view.

The processor 311 performs the functionality described with respect to FIG. 3A. The processor 311 communicates with a metal etcher to start, control and stop the overetch process.

Figure 4:
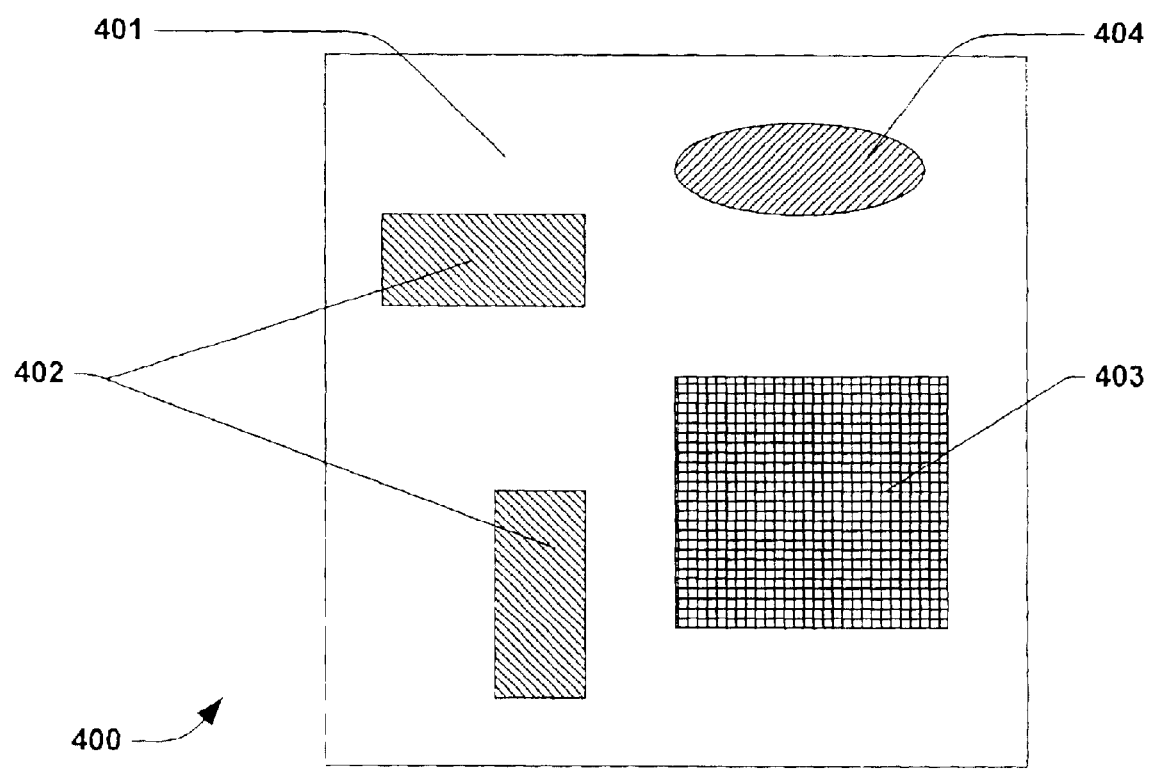
FIG. 4 illustrates a two dimensional etch model.

FIG. 4 illustrates a two dimensional etch model 400 according to one aspect of the invention. The model 400 is typically created on a computer using software such as CAD software. The model 400 includes two dimensional information useful for overetch processes. The model 400 is usually based on a single circuit design. The model 400 includes boundary conditions or design rules, such as minimum pitch, line width, spacing and the like for the design. The model 400 can also include allowable ranges for parameters such as oxide loss (due to overetch), etch rate, CD, etch profile and uniformity. It is appreciated that a single circuit design can have a variety of layouts to provide different functionality. Thus, the model can have one or more layouts associated with the design, yet each layout is bound to the allowable parameters and design rules.

A key characteristic shown by the model 400 is the etch rate of different areas or sections of the semiconductor device. Etch rates for semiconductor devices vary for different parts of the device. Generally, open areas on a device have more space between metal lines. Open areas have more etchant ions available because there are less metal ions in the general area for the etchant ions to combine with. In contrast, dense areas on a device have more metal lines and less space between the lines. Generally, open areas have a faster or higher etch rate than dense areas. The model 400 also includes non etchable areas. Non etchable areas are areas or regions that will not be etched.

Building of the model 400 typically starts with utilizing layout data for the design. The layout or model is divided into a plurality of etch rate regions (401, 402, 403 and 404). Each region is selected to have similar etch rates throughout that region. Etch rates are selected based on expected rates from formulas and previous metal etch processes. Any number of etch rate regions may be created for a model. In general, the more etch rate regions, the more accurate the model. Etch rates for a model may be updated after performing overetch processes on the semiconductor device. It is appreciated that the model 400 requires compliance with the design rules and/or boundary constraints of the layout. The model 400 can also include yield data or estimates for the layouts.

Model 400 is shown with etch rate regions 401, 402, 403 and 404. As stated above, each region is assigned a region etch rate. The total area of the model 400 is calculated. An overall etch rate may be determined for the model as a function of the etch rate regions, area and the region etch rate for each of the etch rate regions.

Figure 5A:
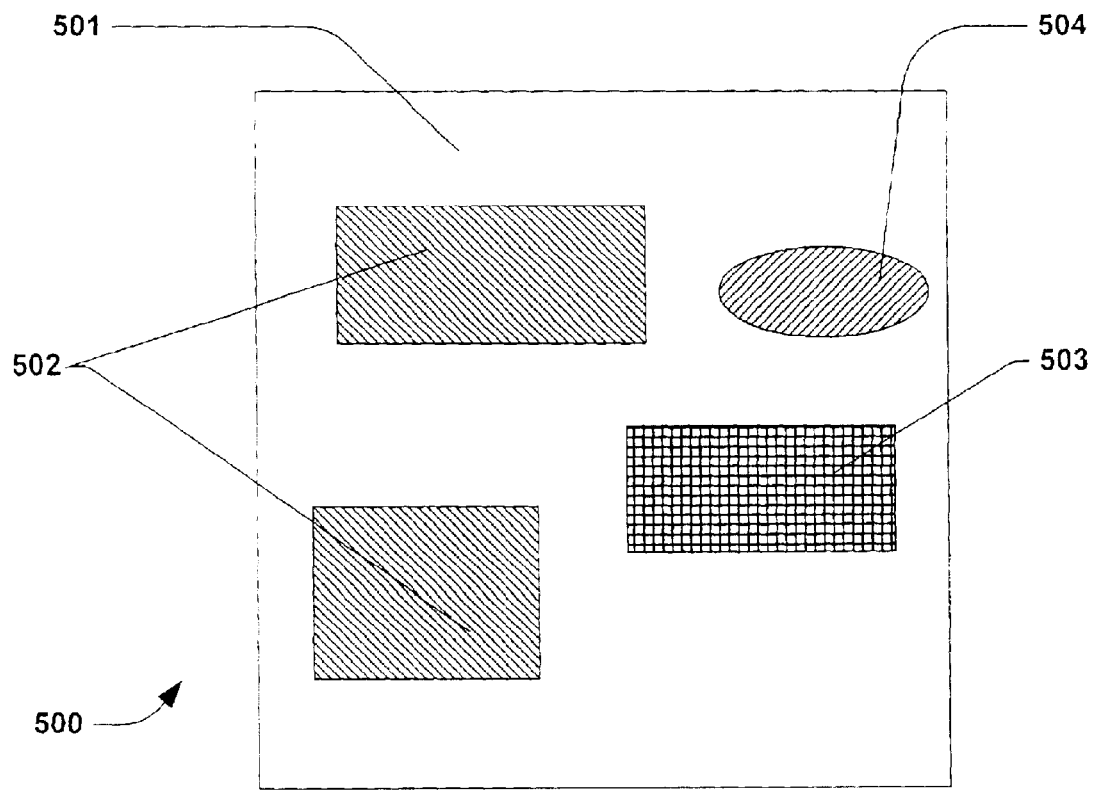
FIG. 5A illustrates a plan view of a three dimensional etch model.
Figure 5B:
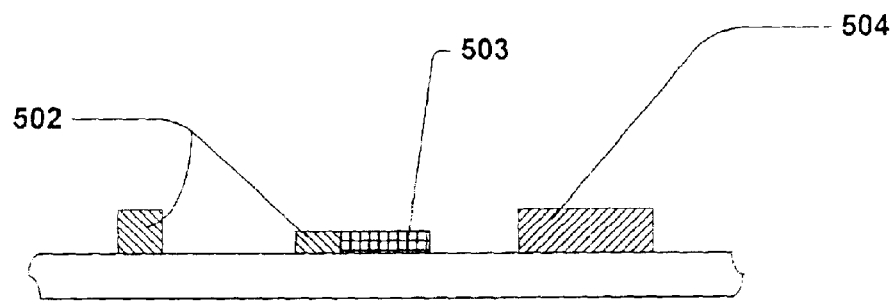
FIG. 5B illustrates a side view of the three dimensional etch model.

FIGS. 5A and 5B illustrate a three dimensional etch model 500 according to one aspect of the invention. FIG. 5A shows a plan view of model 500. FIG. 5B shows a side view of model 500. The model 500 is typically created on a computer using software such as CAD software. The model 500 includes all of the information described with respect to the model 400 of FIG. 4. The model also includes 3-dimensional information useful for overetch processes. The model is usually based on a single circuit device.

A key characteristic shown by the model 500 is the etch rate of different areas or sections of the semiconductor device. Etch rates for semiconductor devices vary for different parts of the device. Generally, open areas on a device have more space between metal lines. Open areas have more etchant ions available because there are less metal ions in the general area for the etchant ions to combine with. In contrast, dense areas on a device have more metal lines and less space between the lines. Generally, open areas have a faster or higher etch rate than dense areas.

Building of the model 500 typically starts with utilizing layout data for the semiconductor device. The layout or model is divided into a plurality of etch rate regions (501, 502, 503 and 504). Each region is selected to have similar etch rates throughout that region. Etch rates are selected based on expected rates from formulas and previous metal etch processes. Any number of etch rate regions may be created for a model. In general, the more etch rate regions, the more accurate the model. Etch rates for a model may be updated after performing overetch processes on the semiconductor device. Each region can have an x and y component along with a z component.

Model 500 is shown with etch rate regions 501, 502, 503 and 504. As stated above, each region is assigned a region etch rate. An overall area is determined for the model 500. The overall area includes all 3 dimensions. Areas of the etch rate regions 501, 502, 503 and 504 are also calculated. An overall etch rate may be determined for the model as a function of the etch rate regions, the region etch rate for each of the etch rate regions and the area.

It is appreciated that alternate aspects of the invention include a model determines a layout based on the design rules and input parameters. The input parameters can include technology, device size, desired yield, desired uniformity and the like.

Figure 6:
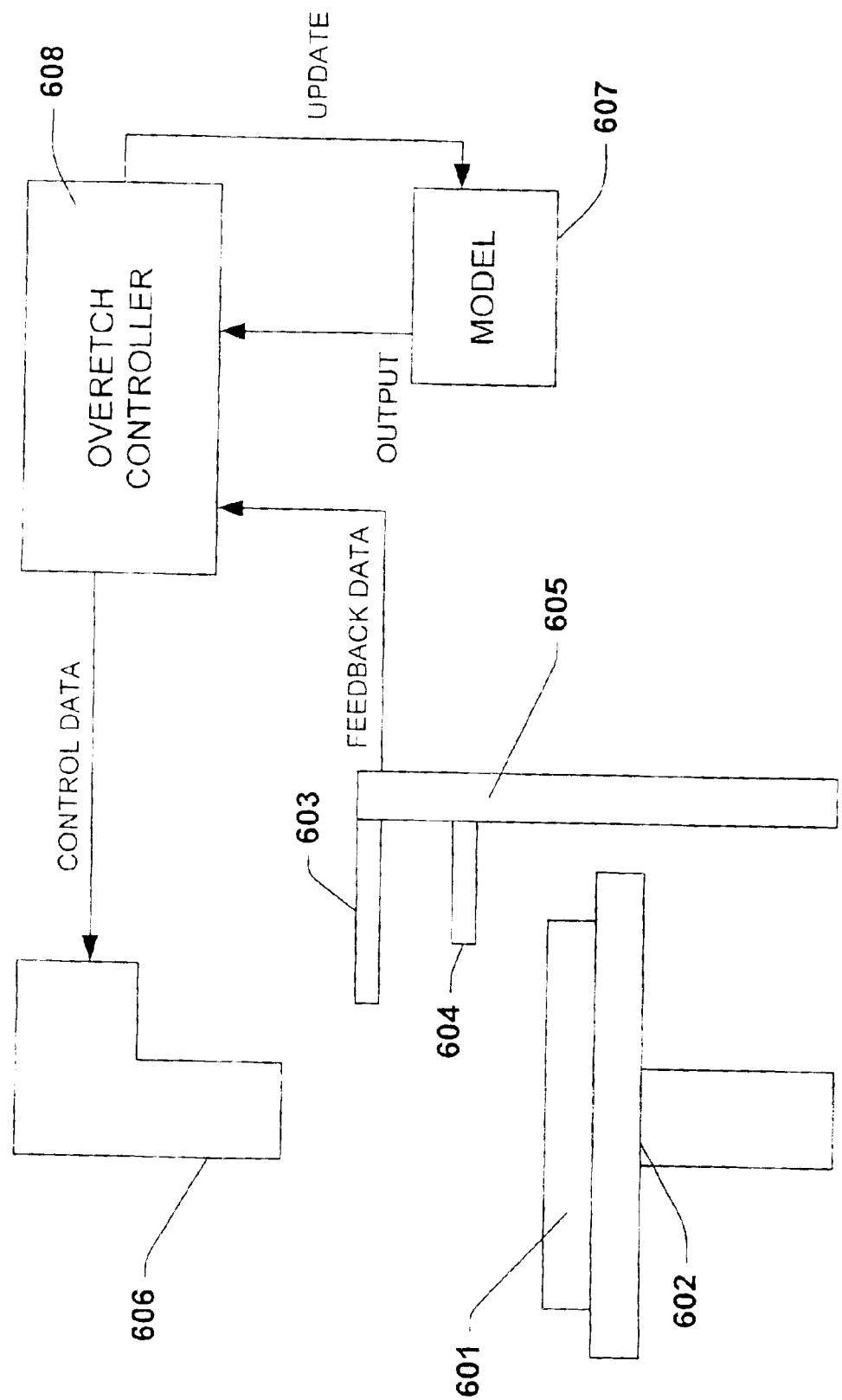
FIG. 6 illustrates an overetch system.

FIG. 6 illustrates an overetch system according to one aspect of the invention. The system is a self adapting system to perform overetching or secondary etching of devices. The system includes an etcher 606, multiple beam sensor 603, sensors 604, device model 607 and an overetch controller 608. The system is able to operate on a target device 601. The target device 601 is held by a rotatable chuck 602. An adjustable arm 605 holds the multiple beam sensor 603 and sensors 604.

The target device 601 is a wafer having semiconductor device. It is appreciated that the wafer can have a large number of semiconductor devices on it. The target device 601 is at a stage of processing in which a metallization step is to be performed.

The device model 607 includes a variety of information about the target device 601. The device model 607 corresponds to a circuit design for the semiconductor device. The device model 607 includes a number of layouts for the circuit design. Additional layouts can be added to the device model 607. Further, the layouts can be modified or updated. The device model 607 can generate additional layouts based on set design parameters. It is appreciated that a single circuit design can be used for a variety of functions or applications, such as a flash memory used in a server or a wireless phone, and require different layouts. Thus, the device model 607 can identify or generate a layout based on input design parameters.

The device model 607 includes design rule information such as minimum pitch, line size spacing and other minimum geographies. The device further includes overetch parameters such as etch rate, CD, oxide loss and uniformity. The device model 607 is able to compute and output a variety of information such as, percentage of open area, ideal overetch rate and estimated overetch time. The device model 607 also outputs the overetch parameters. This information is typically sent to the overetch controller 608. It is noted that this information also relates to yield and yield estimates.

As stated above, the multiple beam sensor 603 and sensors 604 are held by the adjustable arm 605. The multiple beam sensor 603 and sensors 604 send feedback data to the overetch controller. The feedback data generally indicates how the overetch process is progressing. The multiple beam sensor 603 uses any number of beams to measure uniformity of the target device 601 during an overetch process. These uniformity measurements are provided to the overetch controller 608 as part of the feedback data. Sensors 604 measure a variety of overetch parameters, such as, oxide loss, etch rate, CD and profile. These measurements are also provided to the overetch controller 608 as part of the feedback data. Conventionally, similar measurements were only taken after completion of the overetch process.

The etcher 606 can be a conventional type metal etcher. The etcher performs the overetch process according to control data received from the overetch controller 608. The etcher 606 typically performs a metal etch process before performing the overetch process. The etcher 606 is able to modify an overetch process in progress as directed in the control data from the overetch controller 608.

The overetch controller 608 controls the overetch process. It may also control the metal etch process. The overetch controller 608 can be implemented using one or more processors and a memory device. The memory device can include all types of memory, such as dynamic or static. The memory device can also include permanent storage devices such as hard drives and the like. The functionality of the overetch controller 608 can be implemented with program code executing on the one or more processors.

The overetch controller 608 receives a variety of information output from the device model 607. The information includes, for example, percentage of open area, ideal overetch rate and estimated overetch time. The overetch controller 608 sends update information to the device model 608. The update information can include layout selection, functionality, parameter updates and the like. Further, the update information includes overetch process parameters such as etch rate, CD, oxide loss and uniformity.

The controller 608 sends control data to the etcher 606. The control data includes a variety of information on performing the overetch. The control data can include, for example, starting and stopping of the overetch process, altering chemistry of process, adjusting etch rate of overetch process and the like. The controller 608 also receives feedback data, in real-time, from the multibeam sensor 603 and the sensors 604. The controller 608 analyzes the feedback data and modifies the overetch process accordingly. Thus, the controller 608 adapts the overetch based on the overetch parameters from the device model 607 and the feedback data so that actual conditions on the wafer comply with what is permitted according to the device model 607. It is appreciated that the overetch parameters also correlate to a yield or yield percentage. Thus, the controller 608 can also modify the overetch process to increase yield.

Figure 7:
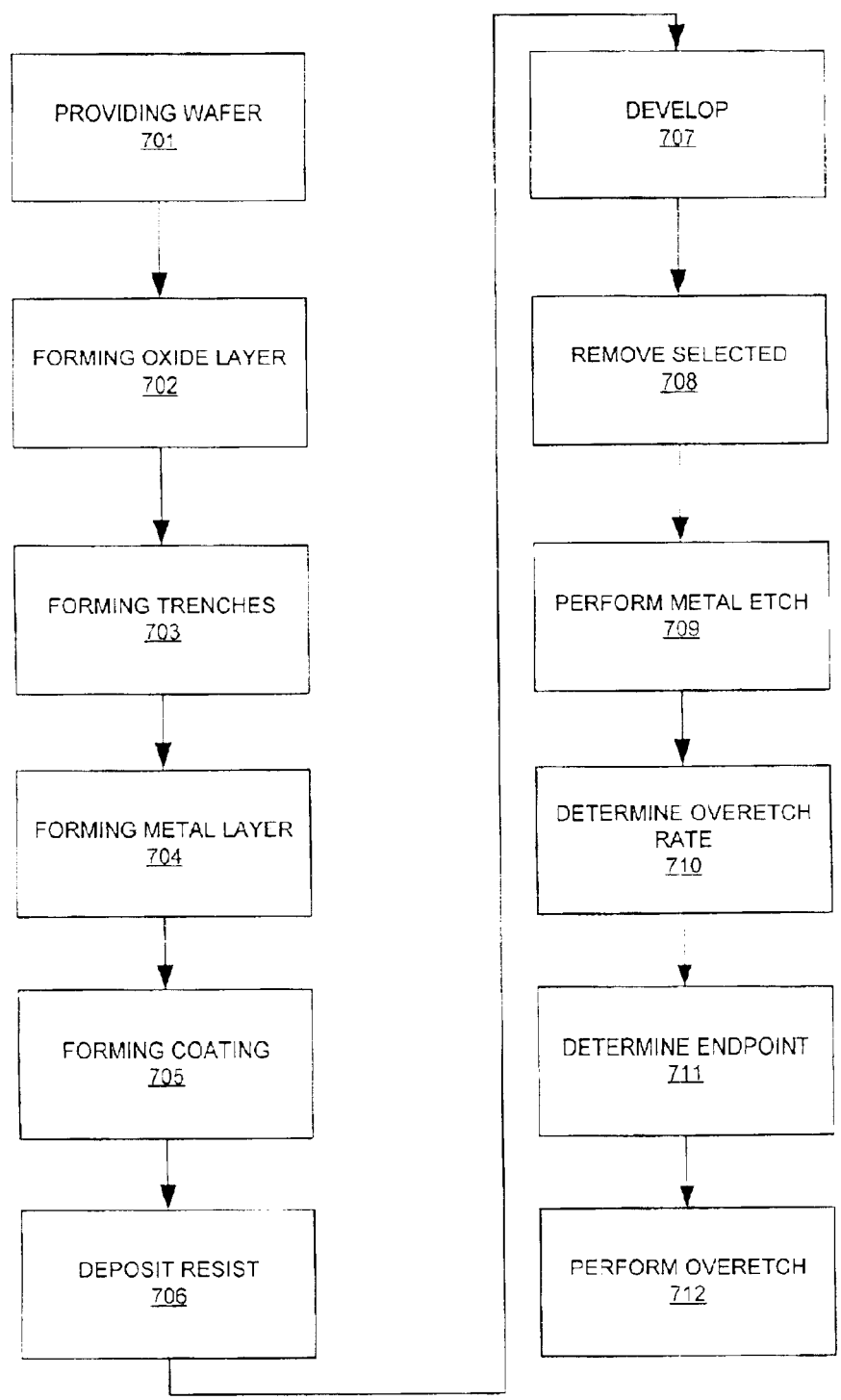
FIG. 7 is a flow diagram for a method of fabricating a semiconductor device.

FIG. 7 is a flow diagram for a method of fabricating a semiconductor device according to one aspect of the invention. A wafer having at least one semiconductor layer is provided at block 701. An oxide layer is formed on the wafer at block 702. A plurality of trenches are formed in the oxide layer at block 703. A barrier layer may be formed on the oxide layer and in the plurality of trenches. A metal layer is formed over the oxide layer and in the plurality of trenches at block 704. The metal layer comprises a metal such as aluminum or an aluminum alloy. An antireflective coating material is deposited over the metal layer at block 705. A resist layer is deposited over the metal layer at block 706. Using a mask, selected portions of the resist layer are developed at block 707. The selected portions correspond with the plurality of trenches. The selected portions of the resist layer are removed at block 708.

A metal etch is performed at block 709 to substantially remove the metal layer from areas exposed or not covered by the remaining resist layer. The metal etch may also remove the antireflective coating. Portions of the oxide layer are not generally removed by the metal etch. An effective overetch rate is determined at block 710 for the wafer by utilizing an etch rate model of the semiconductor device. An overetch endpoint is determined at block 711 for the wafer by utilizing the etch rate model and the effective overetch rate. An overetch is performed utilizing the overetch endpoint at block 712 to remove an overetch amount of the oxide layer along with remaining metal thereby forming isolated interconnection lines for the semiconductor device. During the overetch, various overetch parameters such as etch rate, oxide loss, CD and uniformity can be monitored and compared with the etch rate model. If one of the overetch parameters is out of a tolerable range or is changing too rapidly, the overetch may be adjusted to compensate for the parameter. Additionally, the overetch may remove the barrier layer if it had been deposited.

Figure 8:
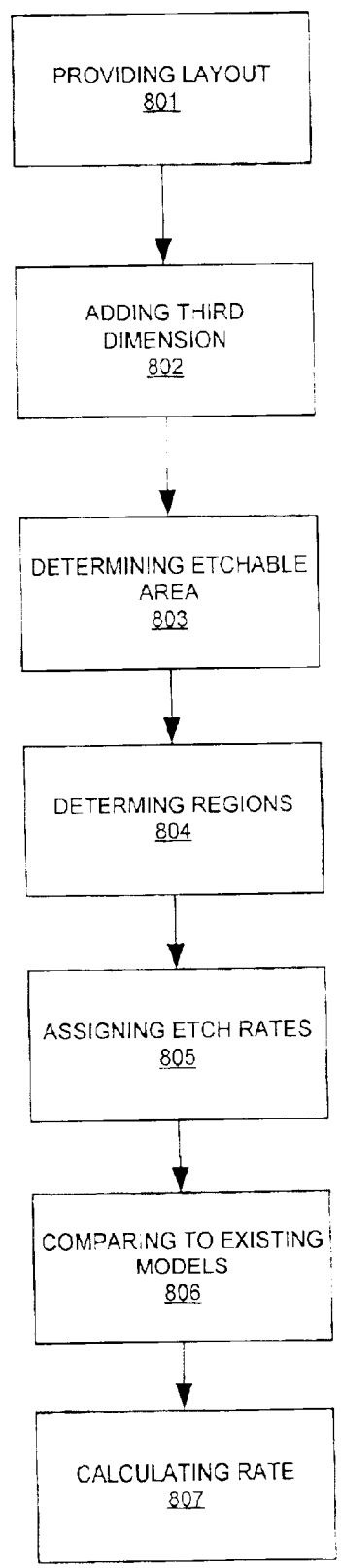
FIG. 8 is a flow diagram for a method of fabricating an etch control model.

FIG. 8 is a flow diagram for a method of fabricating an etch control model for a semiconductor device according to one aspect of the invention. Providing a two dimensional layout of the semiconductor device at block 801. The two dimensional layout may be provided from a layout designer. Information for a third dimension is added to the layout at block 802. The information or data for the third dimension can be provided by a process engineer. This third dimension information may include information, such as topography information, contact thickness and depth of contacts. It is appreciated that a single circuit design for a semiconductor device can have a number of different layouts. It is also appreciated that the layout compensates for effects such as proximate effects, phase shifts, loading effects and the like. Further, it is appreciated that the layout complies with design rules such as pitch, line width, spacing and the like. An etchable area for the model is determined at block 803 based on the layout. At least one etch rate region is determined for the model at block 804. The at least one etch rate region can be determined by assigning or subdividing areas having similar characteristics. Etch rates are assigned for the at least one etch rate region at block 805. The etch rates are assigned as a function of chemicals used for etching, metals to be etched and openness or denseness of the at least one etch rate region. The etchable area and the at least one etch rate region to preexisting models and having various layouts at block 806. Alternate aspects of the invention may not compare to preexisting models. An acceptable etch rate and etch time are calculated at block 807. The acceptable etch rate is the rate at which metal and films are sufficiently removed from selected areas without removing more than a tolerable amount of oxide from the selected areas of the semiconductor device. The etch time is the duration of an overetch process at the etch rate that sufficiently removes metal and films from selected areas without removing more than a tolerable amount of oxide. The etch rate and etch time also take into consideration parameters such as yield, uniformity, profile and CD. These parameters can include ranges of acceptable values along with ideal values. The selected areas correspond to the at least one etch rate region.

Alternate aspects further include recalibrating the model based on test results. Additionally, an existing model can be updated with new information, such as layout changes.

Figure 9:
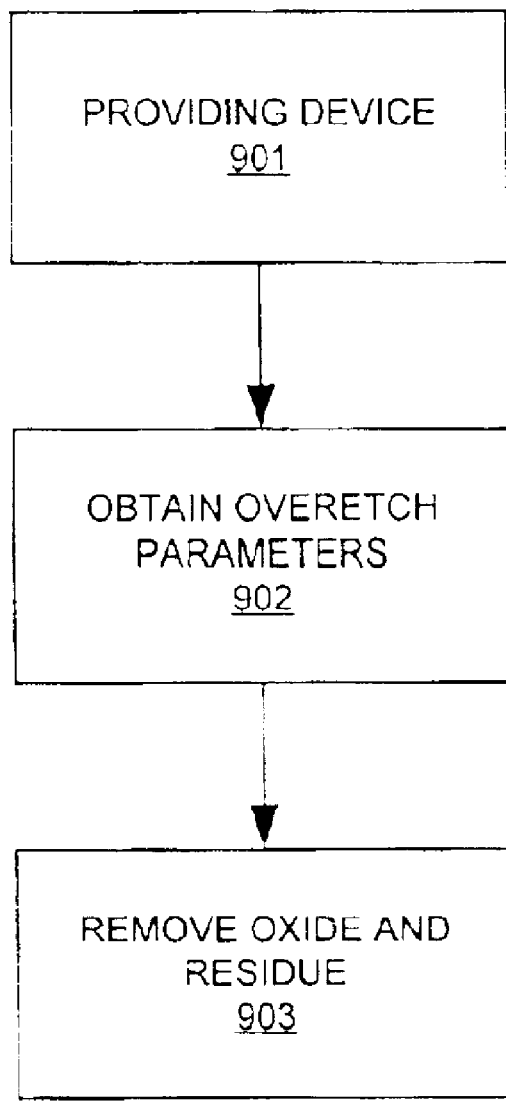
FIG. 9 is a flow diagram for a method of fabricating a semiconductor device.

FIG. 9 is a flow diagram for a method of fabricating a semiconductor device according to one aspect of the invention. A semiconductor device having remaining residue on an oxide layer is provided at block 901. The semiconductor device is based on a circuit design having a number of layouts. The semiconductor device is based on a layout of the number of layouts. The remaining residue comprises metal, such as aluminum or aluminum alloy, films, coatings or barrier layer material. A device model is referenced to obtain overetch process parameters at block 902. These parameters include acceptable ranges of the parameters. The process parameters include acceptable oxide loss, etch rates, CD, profile and uniformity. The process parameters include an overetch endpoint which is an estimated time or duration for the overetch process at a determined etch rate. The device model can include 2 dimensional layout information and/or 3 dimensional layout information. The overetch endpoint is a time period for performing an overetch that includes processing conditions, chemicals and etch rates. An overetch is performed at block 903 removing a tolerable or acceptable amount of the oxide layer and the remaining residue while monitoring and complying with the process parameters.

Figure 10:
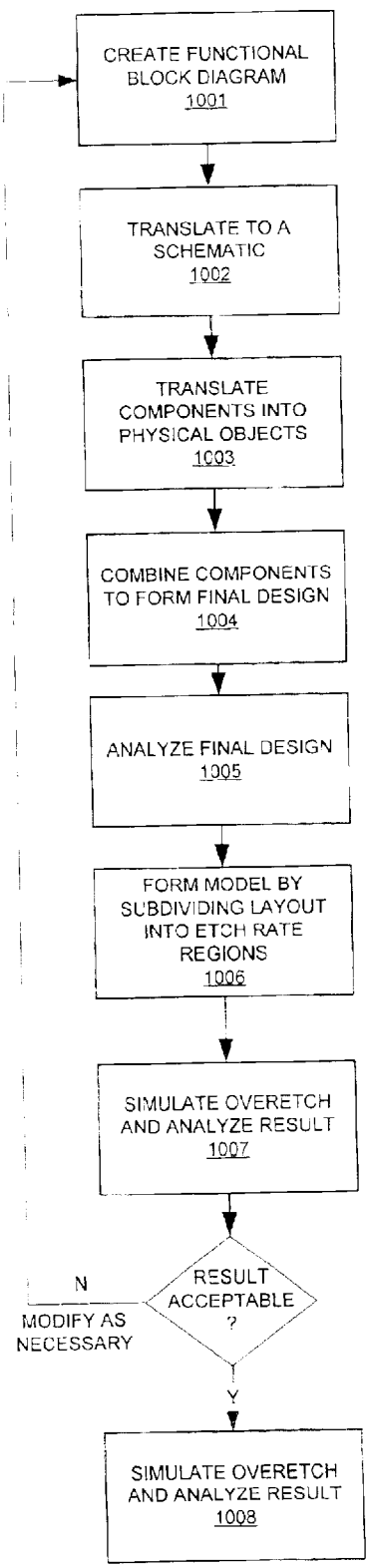
FIG. 10 is a flow diagram for a method of fabricating a device model.

FIG. 10 is a flow diagram of a method of fabricating a model for a semiconductor device according to one aspect of the invention. A circuit designer creates a functional block diagram of a device at block 1001. This block diagram lays out the primary functions and operations required for the device. The circuit designer translates the functional diagram to a schematic diagram at block 1002. The schematic diagram identifies the number and connection of various circuit components.

Figure 11:
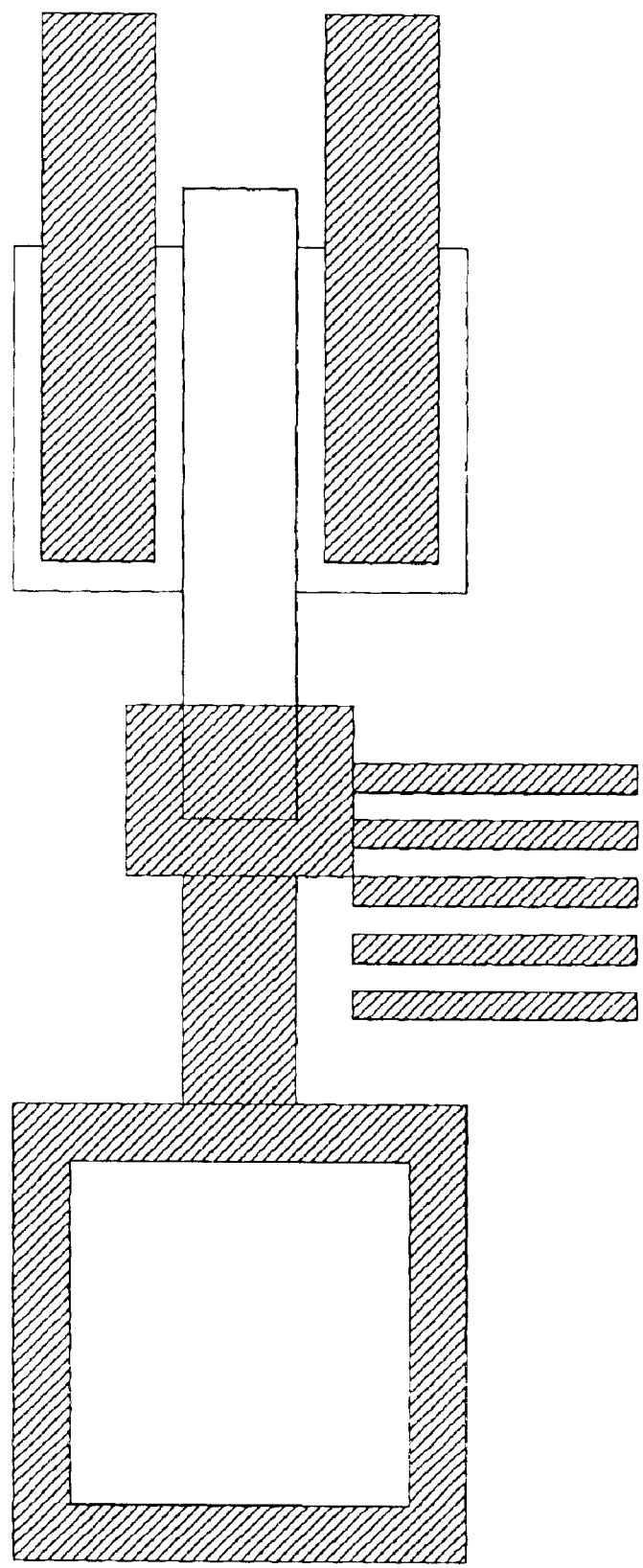
FIG. 11 is an illustration of a composite drawing for a device.

Layout of the semiconductor device depends on a number of factors, including material resistivity, material physics and the physical dimensions of the individual components. Additionally, the placement of components relative to each other is another factor. Further, the technology and feature size (such as 0.25, 0.18 or 0.13 micron) also impose design rules or constraints on the layout. Also, effects such as proximate effects, phase shifting and loading effects are accounted for. A computer-aided design (CAD) system is used to translate each circuit component into a physical shape and size at block 1003. Each circuit component is combined to form the final design using the CAD system at block 1004. The final design includes a composite drawing and a number of layer drawings. The composite drawing, shown in FIG. 11, is a composite picture of an exemplary circuit surface showing all of the sublayer patterns.

The composite drawing is analyzed at block 1005 to determine etch rates of materials to be used for fabricating the semiconductor device. The composite drawing and etch rates are used at block 1006 to subdivide the composite drawing into a plurality of overetch rate regions and thus, forming the model. Alternately, the layer drawings may be used to determine etch rates and create the overetch rate regions. Additionally, acceptable overetch process parameters, such as oxide loss, etch rates, profile, CD and uniformity, can be added to the model.

Overetch simulations are run using the model to analyze a simulated overetch process on the model at block 1007. Also, yield percentages or process yields can be determined by analyzing the results of the simulation. If the results are acceptable, the model and design of the model is considered final and the model can then be used in actual wafer processing at block 1008.

If the results are not acceptable, the design, including the layout, can be modified to improve the results. Additionally, process parameters can be adjusted. It is important to note that process yield is always an important factor and modifications can be made to improve this. Once the model has been modified, further simulations can be run and further results obtained. The model and simulation iterations can be performed until the results are acceptable. Once they are determined to be acceptable, the model is considered final and can then be used in wafer processing at block 1008.

What has been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. An overetch system comprising:
   a metal etcher to perform overetching;
   a target device placed in the metal etcher; and
   an overetch controller coupled to the metal etcher to control overetching and removal of an overetch amount of material from the target device, the controller including:
   an overetch time controller;
   a set of etch control models that comprise three dimensional information; and
   a control system.

2. The system of clam 1, wherein the metal etcher is able to perform metal etching and metal overetching.

3. The system of claim 1, wherein the overetch controller controls overetching utilizing feedback data.

4. The system of claim 1, further comprising at least one sensor to measure feedback data of the target device during overetching and to provide the feedback data to the overetch controller, wherein the overetch controller utilizes the feedback data to control overetching.

5. The system of claim 1, wherein the overetch time controller initiates and halts the metal etcher during overetch processes.

6. The system of claim 1, wherein the control system is implemented on a computer system.

7. The system of claim 1, wherein the control system identifies the target device and selects at least one relevant model from the set of etch control models.

8. The system of claim 1, wherein the target device is a wafer including at least one semiconductor device including a metal layer comprising aluminum or an aluminum alloy.

9. The system of claim 8, wherein the wafer has an oxide layer covered with remaining residue from a metal etch process.

10. The system of claim 9, wherein the remaining residue comprises unremoved aluminum.

11. An overetch system comprising:
    a metal etcher that performs overetching;
    a target device placed in the metal etcher; and
    an overetch controller coupled to the metal etcher to control overetching and to control removal of an overetch amount of material from the target device, the controller including:
    an overetch time controller that initiates and halts the metal etcher during overetch processes;
    a set of etch control models that includes layout data, etchable area, and percentage of etchable area; and
    a control system.

12. The system of claim 11, wherein the control system is implemented on a computer system.

13. The system of claim 11, wherein the control system identifies the target device and selects at least one relevant model from the set of etch control models.

14. The system of claim 11, wherein the etch control models comprise two-dimensional information.

15. The system of claim 11, wherein the etch control models comprise three-dimensional information.

16. The system of claim 11, wherein the metal etcher is able to perform metal etching and metal overetching.

17. The system of claim 11, wherein the overetch controller controls overetching utilizing feedback data.

18. The system of claim 11, further comprising at least one sensor to measure feedback data of the target device during overetching and to provide feedback data to the overetch controller, wherein the overetch controller utilizes the feedback data to control overetching.

19. The system of claim 11, wherein the target device is a wafer including at least one semiconductor device including a metal layer comprising aluminum or an aluminum alloy.

20. The system of claim 19, wherein the wafer has an oxide layer covered with remaining residue from a metal etch process.

21. The system of claim 20, wherein the remaining residue comprises unremoved aluminum.

22. An overetch system comprising:
    a target device;
    a metal etching means for removing an ovcretch amount of material from the target device; and
    an overetch control means for controlling the metal etching means, the overetch control means comprising:
    a set of etch control models that comprise three dimensional information;
    a timer means for initiating and halting the metal etching means; and
    a control means for selecting at least one relevant model from the set of etch control models and determining an overetch endpoint.

23. The overetch system of claim 22, wherein the set of etch control models include layout data, etchable area and percentage of etchable area.

24. An overetch removal system comprising:
    a target device;
    a metal etching means for removing an overetch amount of material from the target device; and
    an overetch control means for controlling the metal etching means, the overetch control means comprising:
    a set of etch control models that include layout data, etchable area and percentage of etchable area;
    a timer means for initiating and halting the metal etching means; and
    a control means for selecting at least one relevant model from the set of etch control models and determining an overetch endpoint.

* * * * *

UNITED STATES PATENT AND TRADEMARK OFFICE
CERTIFICATE OF CORRECTION

PATENT NO.   : 6,808,591 B1
DATED        : October 26, 2004
INVENTOR(S)  : Khoi A. Phan et al.

It is certified that error appears in the above-identified patent and that said Letters Patent is hereby corrected as shown below:

Column 11,
Line 48, please change "clam" to -- claim --.

Column 12,
Line 42, please change "ovcretch" to -- overetch --.

Signed and Sealed this

Seventh Day of June, 2005

JON W. DUDAS
*Director of the United States Patent and Trademark Office*